United States Patent
Vora et al.

(10) Patent No.: US 6,765,409 B2
(45) Date of Patent: Jul. 20, 2004

(54) VERY LOW POWER, HIGH PERFORMANCE UNIVERSAL CONNECTOR FOR RECONFIGURABLE MACRO CELL ARRAYS

(75) Inventors: Madhu Vora, Los Gatos, CA (US); Yogendra Bobra, San Jose, CA (US)

(73) Assignee: Extensil Corporation, Sunnyvale, CA (US)

( * ) Notice: Subject to any disclaimer, the term of this patent is extended or adjusted under 35 U.S.C. 154(b) by 0 days.

(21) Appl. No.: 10/238,931

(22) Filed: Sep. 9, 2002

(65) Prior Publication Data

US 2003/0057999 A1 Mar. 27, 2003

Related U.S. Application Data

(60) Provisional application No. 60/322,255, filed on Sep. 13, 2001.

(51) Int. Cl.$^7$ ............................................. H03K 19/177
(52) U.S. Cl. .............................. 326/41; 326/37; 326/86; 326/47
(58) Field of Search ............................... 326/37, 1, 41, 326/86

(56) References Cited

U.S. PATENT DOCUMENTS

| | | | |
|---|---|---|---|
| 4,870,302 A | | 9/1989 | Freeman |
| 5,317,209 A | * | 5/1994 | Garverick et al. .......... 307/465 |
| 5,504,440 A | | 4/1996 | Sasaki |
| 6,051,991 A | * | 4/2000 | Ting .......................... 326/41 |

* cited by examiner

*Primary Examiner*—Michael Tokar
*Assistant Examiner*—Anh Q. Tran
(74) *Attorney, Agent, or Firm*—Townsend and Townsend and Crew LLP

(57) ABSTRACT

A low-voltage programmable connector includes two separate paths. Each path includes a buffer and a pair of transmission gates whose control terminals receive the voltages supplied by a memory element associated with that path. If the voltages supplied by the memory elements respectively close the transmission gates in the first path and open those in the second path, signal is transferred from the first terminal to the second terminal of the connector. If the voltages supplied by the memory elements respectively open the transmission gates in the first path and close those in the second path, signal is transferred from the second terminal to the first terminal of the connector. If the voltages supplied by the memory elements open the transmission gates in both the first and second paths, signal transfer between the first and second terminals of the connector is inhibited.

15 Claims, 10 Drawing Sheets

VERY LOW POWER, HIGH PERFORMANCE UNIVERSAL CONNECTOR FOR RECONFIGURABLE MACRO CELL ARRAYS

CROSS-REFERENCES TO RELATED APPLICATIONS

The present application claims benefit of the filing date of U.S. provisional application No. 60/322,255, filed on Sep. 13, 2001, the entire content of which is incorporated herein by reference.

BACKGROUND OF THE INVENTION

The present invention relates to integrated circuits (IC) containing programmable logic, and more particularly to a programmable interconnect structure for use in such ICs.

Advances in semiconductor fabrication processes which have enabled an ever increasing number of transistors to be formed on an IC fabricated on a single semiconductor substrate, and have seen a parallel increase in the type and number of functions that such ICs may perform. One class of ICs, commonly referred to as programmable logic devices (PLD), enables its users to program the functions that the PLD is to perform. The various hardware blocks, commonly known as logic blocks, in a PLD are typically not electrically connected to one another when the PLD is first supplied by its manufacturer. The user must first program the PLD to carry out the functions specified by the user. Programming of a PLD is usually performed with the aid of software in which the interconnections between various logic blocks are first specified, either by means of a table or a list of Boolean functions. After being executed, the software causes the specified interconnections to occur, in other words, it programs the PLD to create the desired logic and interconnections. A PLD thus eliminates the need for design-intensive and time-consuming efforts required for custom-specific ICs A PLD usually includes arrays of logic cells, known as logic blocks, that are programmable and are selectively connected to arrays of interconnect lines to attain both combinatorial as well as sequential logic functions. Programming of programmable logic blocks, as well as their connections to the selected lines (e.g., bus lines), is typically achieved by establishing the states of a multitude of programmable elements, such as memory cells or fuses, disposed in the PLD. The logic blocks disposed in a PLD often arc divided into arrays of AND and OR functions, adapted to perform the specified functions.

One type of PLD is programmable array logic (PAL). In a PAL, the AND arrays are programmable, while the OR arrays are fixed. Accordingly, in a PAL, the AND gates are programmed to provide the product term logic signals which are subsequently summed by the OR gates.

Another type of PLD is known as programmable logic array (PLA) in which both the AND and OR arrays are programmable. In a PLA, the product terms in the AND array may be shared by the OR array to provide the specified logic functions. Both PALs and PLAs often include flip-flops, in addition to the AND and OR arrays, to provide sequential logic operations.

A disadvantage of both PALs and PLAs is their logic utilization. In other words, after being configured, some of the logic blocks disposed within a PLD may remain unutilized. To increase their utilization, PLDs have been adapted to include one or more macro cells. A macro cell is a logic block or a group of logic blocks that may be configured to perform many different and relatively more complex logic functions. A macro cell may be selectively interconnected to other macro cells or logic blocks. Macro cells enable attainment of a more granular structure and, therefore, increase the utilization of the semiconductor surface area in which the PLD is formed and, therefore, reduce cost.

Another type of IC which integrates a number of macro cells, analog and/or memory blocks on the same silicon substrate is commonly referred to as system-on-chip (SoC). An SoC may be configured to perform functions that would otherwise require several different ICs to perform.

The macro cells disposed in a conventional SoC are typically either hard wired during the fabrication process or are later programmed (i.e., configured) following the fabrication process. If hardwired during the fabrication process, an SoC may not be reconfigured following the completion of the fabrication process. If not configured during the fabrication process, an SoC is often configured with the aid of software. Such configuration software may be subsequently used to reconfigure the SoC to enable it to perform functions that are different from those for which the SoC was configured before. A reconfigurable SoC often employs arrays of interconnects which are selectively coupled to one another to provide the specified logic functions.

FIG. 2 of U.S. Pat. No. 5,504,440, issued to Sasaki, illustrates an interconnection between a logic cell 20 and input and output buses 23 and 17. Each line of bus 12 is shown as being coupled to an input terminal of logic cell 20 via "a programmable three state buffer operating under control of an input signal supplied to it on line 54. Line 54 is coupled to a register or other means within which the program for controlling the overall programmable logic device is stored."

As disclosed in Sasaki, "A separate bit in this register, memory, a fuse or other means, is used to control a corresponding one of the programmable connections in the drawing in FIG. 2. Other bits are used to control other programmable connections elsewhere in the programmable logic device. Thus the control memory typically will have as many bits stored therein as there are programmable connections to be controlled. Of course, where two configurations are mutually exclusive and one, and only one, is always provided, the complementary state of a single bit can control two configurations. Under control of the memory bit, circuit 52a is either active or in a high impedance state. When the input 54a is enabled, circuit 52a repeats the signal coupled to its input node 57a. In other words, if a logical 1 is present on conductor 12a of bus 12, then input node 57a of driver 52a will be a logical 1. Assuming that control line 54a is enabled, then the output from driver 52a will also be a logical 1. Of course, the same conditions apply if a logical 0 is present on conductor 12a. Each of the drivers 52 functions in the same manner. On the other hand, if control line 54 is not enabled, then the driver circuits present a high impedance state and functionally behave as an open circuit. In other words, node 55 is completely disconnected from bus 12. This allows an input node 41 to be disconnected from the bus 12 when that input node is not to receive signals from bus 12."

FIG. 9A of U.S. Pat. No. 4,870,302, issued to Freeman, is the schematic of a circuit for making a number of different interconnections. "Thus, in FIG. 9A, pass transistor 2, when activated into the conducting state, connects lead 90-3 to lead 90-1. Pass transistor 1, when conducting, connects lead 90-3 to lead 90-4. Pass transistor 4, when conducting, connects lead 90-4 to lead 90-2 and pass transistor 3, when conducting, connects lead 90-1 to lead 90-2. Pass transistors 6 and 5, when off, separate lead 90-2 from lead 90-3 and separate lead 90-1 from lead 90-4 respectively. Thus, should it be desired to connect vertical lead 90-2 to vertical lead 90-3, pass transistor 6 is activated. Likewise, should it be desired to connect horizontal lead 90-1 to horizontal lead 90-4, pass transistor 5 is activated."

Conventional interconnect structures of the types that are deployed in known PLDs or SoCs may limit the reconfigurability of the macro cells disposed therein and may also limit the speed of operation. Such problems are further compounded as the supply voltages continue to scale down.

BRIEF SUMMARY OF THE INVENTION

A programmable interconnect structure (hereinafter referred to as connector), in accordance with the present invention, includes two separate paths. Disposed within the first path are first and second CMOS transmission gates (hereinafter referred to as transmission gates) and a first buffer. Disposed within the second path are third and fourth transmission gates and a second buffer. A first terminal of the first transmission gate is coupled to a first terminal of the connector. A second terminal of the first transmission gate is coupled to an input terminal of the first buffer. An output terminal of the first buffer is coupled to an input terminal of the second transmission gate whose second terminal is coupled to the second terminal of the connector. Similarly, a first terminal of the third transmission gate is coupled to the second terminal of the connector. A second terminal of the third transmission gate is coupled to an input terminal of the second buffer. An output terminal of the second buffer is coupled to an input terminal of the fourth transmission gate whose second terminal is coupled to the first terminal of the connector. The gate terminals of the NMOS transistors of both the first and second transmission gates receive a first voltage supplied by a first programmable memory element. The gate terminals of the PMOS transistors of both the first and second transmission gates receive a second voltage supplied by the first programmable memory element. The first and second voltages supplied by the first programmable memory elements are complements of one another. The gate terminals of the NMOS transistors of both the third and fourth transmission gates receive a third voltage supplied by a second programmable memory element. The gate terminals of the PMOS transistors of both the third and fourth transmission gates receive a fourth voltage supplied by the second programmable memory element. The third and fourth voltages supplied by the second programmable memory elements are complements of one another.

If the first and third voltages supplied by the first and second programmable memory elements are respectively at high and low levels, the first and second transmission gates are closed while the third and fourth transmission gates are open. Consequently, the first path is in a conducting state and the second path is in a non-conducting state, therefore, current may flow only from the first terminal to the second terminal of the connector.

If the first and third voltages supplied by the first and second programmable memory elements are respectively at low and high levels, the first and second transmission gates are open while the third and fourth transmission gates are closed. Consequently, the first path is in a conducting state and the second path is in a non-conducting state, therefore, current may flow only from the second terminal to the first terminal of the connector.

If the first and third voltages supplied respectively by the first and second programmable memory elements both are at low levels, all four transmission gates are open. Consequently, both the first and second paths are in non-conducting states and, therefore, current flow between the first and second terminals of the connector is inhibited.

The third transmission gate isolates the output terminal of the first buffer from the input terminal of the second buffer—when the connector is configured to transfer signal from its first terminal to its second terminal. Since, the first buffer is not loaded with the input capacitance of the second buffer, power consumption is reduced. Similarly, the first transmission gate isolates the output terminal of the second buffer from the input terminal of the first buffer—when the connector is configured to transfer signal from its second terminal to its first terminal. Since, the second buffer is not loaded with the input capacitance of the first buffer, power consumption is reduced.

The connector further includes a first NMOS transistor associated with the first path and a second NMOS transistor associated with the second path. The drain terminal of the first NMOS transistor is coupled to the input terminal of the first buffer. The source terminal of the first NMOS transistor is coupled to the ground. The gate terminal of the first NMOS transistor is coupled to the second voltage supplied by the first programmable memory element. The drain terminal of the second NMOS transistor is coupled to the input terminal of the second buffer. The source terminal of the second NMOS transistor is coupled to the ground. The gate terminal of the second NMOS transistor is coupled to the fourth voltage supplied by the second programmable memory element. If the first path is open, the first NMOS transistor is on, thereby coupling the input terminal of the first buffer to the ground. Similarly, if the second path is open, the second NMOS transistor is on, thereby coupling the input terminal of the second buffer to the ground.

The buffer in each of the first and second paths reduces the rise and fall times of the signal applied thereto, thereby restoring the signal's shape. The programmable memory elements are programmed during the programming phase, and depending oil the values stored therein, either open or close the transmission gates that they are coupled to.

In accordance with some embodiments of the present invention, each buffer may include one or more CMOS inverters. Each programmable memory element may be a fuse, a non-volatile memory, such as an Electrically Erasable Programmable Read Only Memory (EEPROM), or a volatile memory, such a Static Random Access Memory (SRAM), or a register.

DETAILED DESCRIPTION OF THE INVENTION

Figure 1:
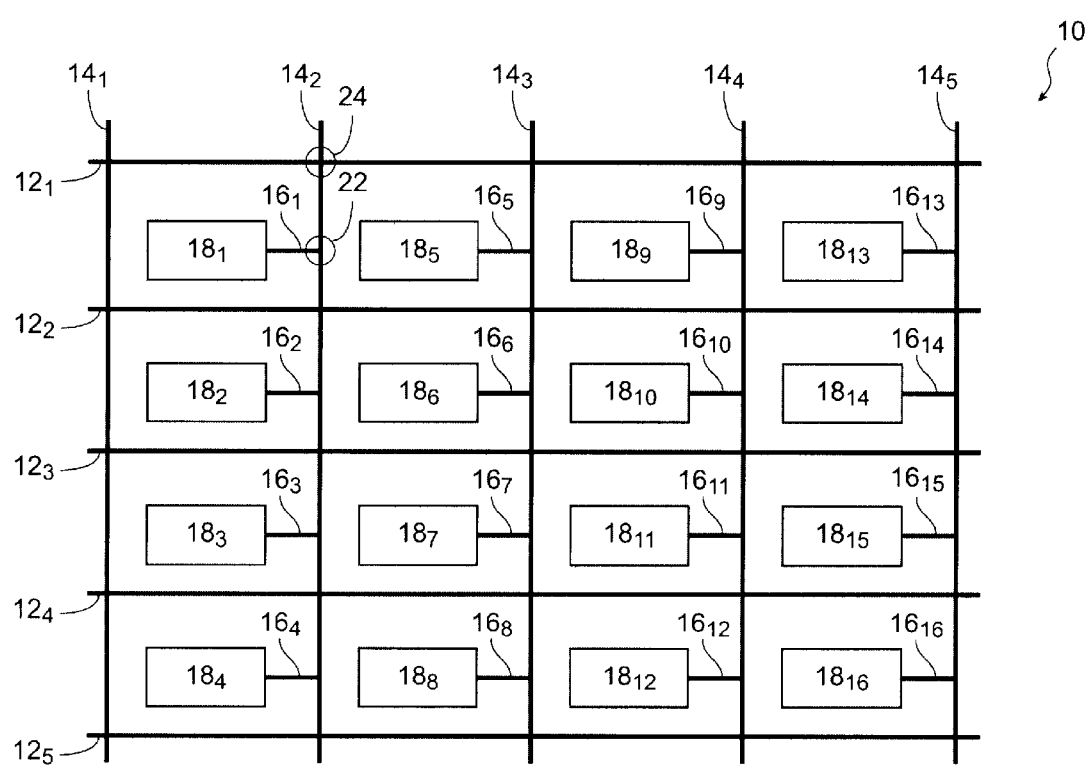
FIG. 1 illustrates a multitude of reconfigurable macro cells disposed within arrays of interconnect lines, in accordance with one embodiment of the present invention.

FIG. 1 is a simplified block diagram of a section of a programmable device 10, in accordance with one embodiment of the present invention. Programmable device 10 (hereinafter device 10) includes, among other components, a number of horizontal long routing channels 12, a number of vertical long routing channels 14, a number of horizontal short routing channels 16 and a number of reconfigurable macro cells is disposed within the arrays of long and short routing channels.

It is understood that each routing channel may be a bus having a multitude of electrically conductive lines. Accordingly, in the following, routing channels are alternatively referred to as buses. It is also understood that programmable device 10 may be a system-on-chip (SoC), a programmable logic device (PLD) or any other semiconductor integrated device adapted to be programmed (i.e., configured). Furthermore, although the following description is made with reference to reconfigurable macro cells 18, it is understood that the programmable interconnect structure, in accordance with the present invention, applies to any other programmable logic cell. In other words, the following description applies to all programmable cells, macro cells, logic blocks, or otherwise.

It is understood that each conductive line of horizontal long buses 12 and vertical long buses 14 includes more than one section, with adjacent sections of each line adapted to be connected to or disconnected from one another via a connector, in accordance with the present invention and as described further below. Short buses, on the other hand, include only one section.

In the following, different instances of similar components are alternatively identified by similar reference numerals having different indices—the indices appeal as subscripts to the reference numerals. For example, the sixteen shown instances of programmable macro cells 18 are alternatively identified as 181, 182, 183 . . . 1816. Similarly, for example, the five shown instances of horizontal short buses 12 are alternatively identified as 121, 122, 123 . . . 125.

Each reconfigurable macro cell 18 (alternatively referred to hereinbelow as programmable macro cell 18 or macro cell 18) is connected to a different one of short buses 16, which in turn, may be connected to or disconnected from one or more vertical long buses 14 and/or one or more horizontal long buses 12 via a group of universal connectors (not shown in FIG. 1). For example, macro cell 181 is connected to short horizontal bus 161 which, in turn, is connected to vertical long bus 142 at node 22 via a group of universal connectors (not shown). Vertical long bus 142, in turn, is connected to horizontal long, bus 121 via another group of universal conductors (not shown) at node 24. Depending on the specified functions that device 10 is programmed to perform, different instances of macro cells 18 may be connected only to vertical long buses 14 or alternatively, may be connected to vertical long buses 14 as well as to horizontal long buses 12.

The disposition of macro cells 18 within the arrays of long and short buses, as shown in FIG. 1, enables signal transfers in accordance with any of the following conditions. First, a signal may be transferred from an output terminal of a macro cell 18 to a vertical long bus 14—via a short bus 16—from which it may be delivered to an output terminal of device 10. Second, a signal may be transferred from an input terminal of device 10 to an input terminal of a macro cell 18 via a vertical long bus 14 and a short bus 16. Third, a signal may transferred from an output terminal of a macro cell 18 to a vertical long bus 14—via a short bus 16—that, in turn, is coupled to a horizontal long bus 12 from which it is delivered to another short bus 16—via another vertical long bus 14—to an input port of another macro cell 18. Fourth, a signal may be transferred from any vertical long bus 14 to any horizontal long bus 12. Therefore, as shown in FIG. 1, signals may be transferred between any macro cells 18 and between any long and short buses. Each macro cell 18 of device 10 is typically configured to perform a number of logical operations in accordance with a list of Boolean functions or a logic table that is loaded into device 10 during configuration.

Figure 2:
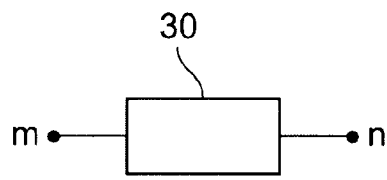
FIG. 2 is a symbol associated with the universal connector prior to being configured, in accordance with one embodiment of the present invention.

FIG. 2 is a symbol of a universal connector 30—prior to being configured—that is disposed between, for example, vertical long bus 142 and each of short horizontal bus 161 and long horizontal bus 121, respectively at nodes 22 and 24 (see FIG. 1). This is explained further below. Each universal connector 30 (alternatively referred to hereinbelow as connector 30) includes two terminals designated as m and n. Depending on the programming state of connector 30, current either (1) flows from terminal m to terminal n or, (2) from terminal n to terminal m or, (3) is inhibited from flowing between terminals m and n.

Figure 3A:
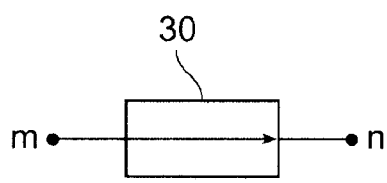
FIGS. 3A–3C are symbols associated with the universal connector of FIG. 2 after being configured.
Figure 3B:
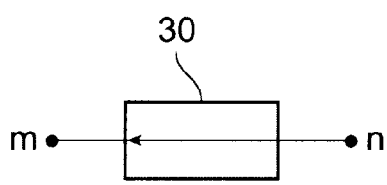
Figure 3C:
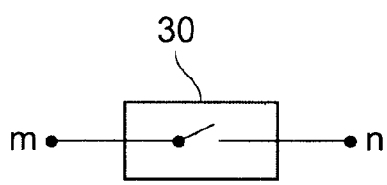

FIG. 3A is a symbol of connector 30 that is configured to conduct current from terminal m to terminal n. The direction of the current flow from terminal m to terminal n is also shown by the direction of the arrow. FIG. 3B is a symbol of connector 30 that is configured to conduct current from terminal n to terminal m; the direction of the current flow from terminal n to terminal m is also shown by the direction of the arrow. FIG. 3C is a symbol of connector 30 that is configured to inhibit current flow between terminals m and n. Accordingly, in FIG. 3C, terminals m and n are schematically shown as being connected to the terminals of an open switch.

Figure 4:
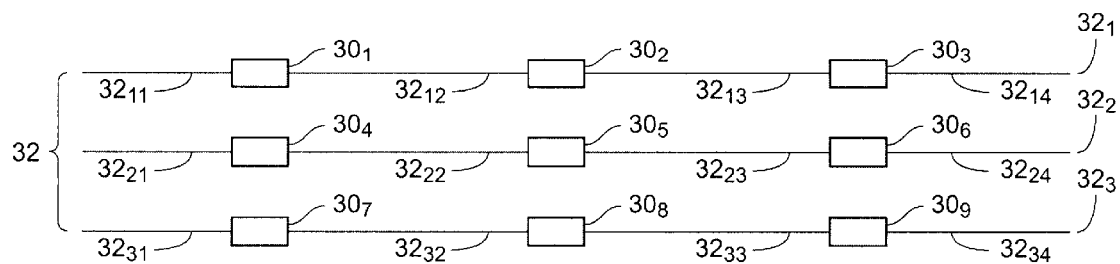
FIG. 4 illustrates a bus having a multitude of interconnect lines each having sections which are adapted to be coupled to or uncoupled from one another via a multitude of universal connectors, in accordance with one embodiment of the present invention.

FIG. 4 illustrates a number of connectors 30 disposed between adjacent sections of bus 32. Bus 32 may be a vertical long bus or may be a horizontal long bus, as shown above. Bus 32 is shown as having three electrically conductive lines (hereinafter referred to as lines) but it will be appreciated that any number of lines may be used. Each line has as many sections as desired. In FIG. 4, four sections are shown. Each section, in turn, is connected to or disconnected from an adjacent section via a connector 30.

Each line of a bus is alternatively identified by a reference numeral which has an index appearing as a subscript thereto. The subscript refers to the line number (i.e., the bit position of the line within the bus) of the bus. Accordingly, in FIG. 4, the three lines of bus 32 are identified by reference numerals 321, 322 and 323. Furthermore, each bus line section is identified by a reference numeral having two-digit index appearing as a subscript thereto The first digit of the index refers to the line number of the bus. The second digit of the index refers to the section number of the line identified by the first digit. Accordingly, for example, reference numeral 3211 refers to the first section of the first line of bus 32 (i.e., bus line 321); reference numeral 3212 refers to the second section of bus line 321; and reference numeral 3214 refers to fourth section of bus line 321. Similarly, for example, reference numeral 3231 refers to first section of the third line of bus 32 (i.e., bus line 323); reference numeral 3232 refers to second section of bus line 323; and reference numeral 3233 refers to third section of bus line 323.

Referring to FIG. 4, connectors 301, 302 . . . 309 connect or disconnect the various line sections of bus 32 between which they are disposed. For example, depending on its conduction state, connector 301 either connects bus section 3211 to or disconnects bus section 3211 from bus section 3212. Similarly, depending on its conduction state, connector 305 either connects bus section 3222 to or disconnects bus section 3222 from bus section 3223. Due to its inherent capacitance and resistance, each line of bus 32 may increase the propagation delay and distort the shape of the signal that it carries. To reduce the propagation delay and restore the signal's shape, a buffer is disposed in each switching path of each connector 301, 302 . . . 309. Each buffer amplifies the signal it receives by providing a voltage gain, thus reducing the propagation delay and restoring the shape of the signal that is carried over the bus line.

Figure 5A:
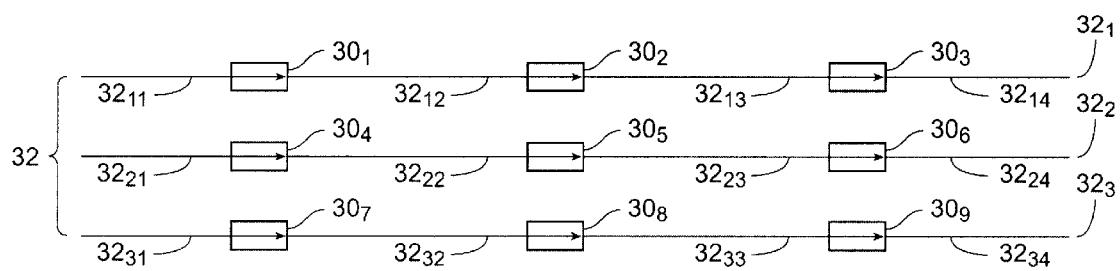
FIGS. 5A–5C illustrates the bus of FIG. 4 following three different configuration processes.
Figure 5B:
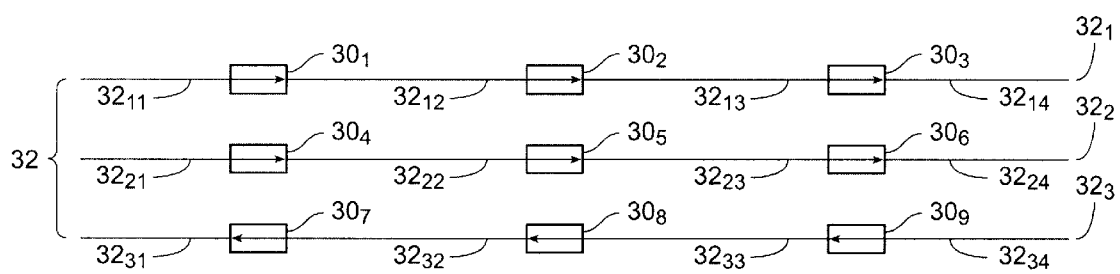
Figure 5C:
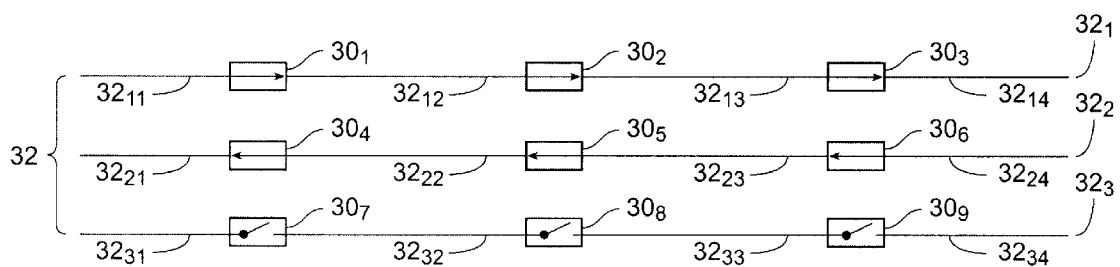

FIG. 5A illustrates an exemplary connectivity between various sections of bus 32 of FIG. 4, in accordance with a first configuration data. As seen from the conduction states of connectors 30, current flows from left to right on all three lines of bus 32. FIG. 5B illustrates another exemplary connectivity between various sections of bus 32 of FIG. 4, in accordance with a second configuration data. As seen from the conduction states of connectors 30, current flows from left to right on lines 321 and 322 and from right to left on line 323. FIG. 5C illustrates another exemplary connectivity between various sections of bus 32 of FIG. 4, in accordance with a third configuration data. As seen from the conduction states of connectors 30, current flows from left to right on lines 321 and from right to left on line 323. No current flows on line 323.

Figure 6:
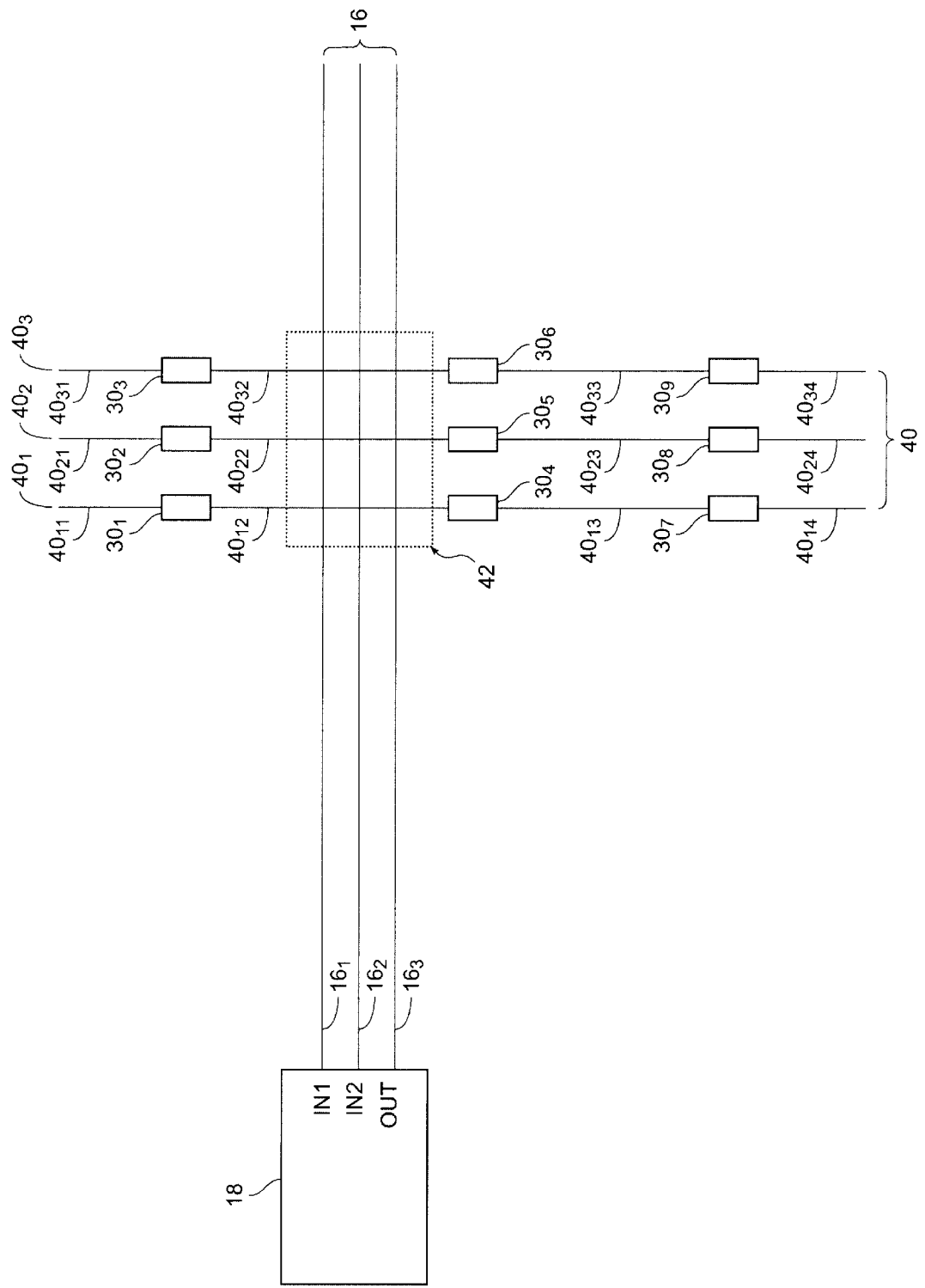
FIG. 6 illustrates a multitude of universal connectors disposed between a long bus and a short bus that, in turn, is coupled to a reconfigurable macro cell, in accordance with one embodiment of the present invention.

FIG. 6 illustrates a programmable macro cell 18 that is coupled to short bus 16 whose lines are, in turn, coupled to or uncoupled from the lines of long bus 40 via a number of connectors 30 (not shown in FIG. 6) disposed within the dotted perimeter line 42. More detailed description of the various connections inside the dotted perimeter line 42 is provided below in connection with FIG. 7. In the exemplary embodiment of FIG. 6, programmable macro cell 18 is shown as having two input terminals IN1 and IN2 that are coupled to short bus lines 161, 162, and one output terminal OUT coupled to bus line 163. It is understood, however, that in other embodiments macro cell 18 may have more or fewer input/output terminals, as is known by those skilled in the art. Moreover, in the exemplary embodiment of FIG. 6, the number of lines of bus 16 is the same as the number of input/output terminals of macro cell 18. However, it is understood that in other embodiments, the number of input/output terminals of macro cell 18 may be different from the number of lines of bus 16.

Referring to FIG. 6, long bus 40 includes 3 lines, each of which is shown as having four sections. Each section of each line of bus 40 is coupled to or uncoupled from an adjacent section of the same bus line via a connector 30. For example, sections 4023 and 4024 may be coupled to or uncoupled from one another by so configuring connector 308. Therefore, connectors 30, in accordance with the present invention, may be configured to establish connectivity between (1) adjacent sections of the same bus line, (2) different lines of different buses and (3) input/output terminals of a macro cell and a bus.

Figure 7:
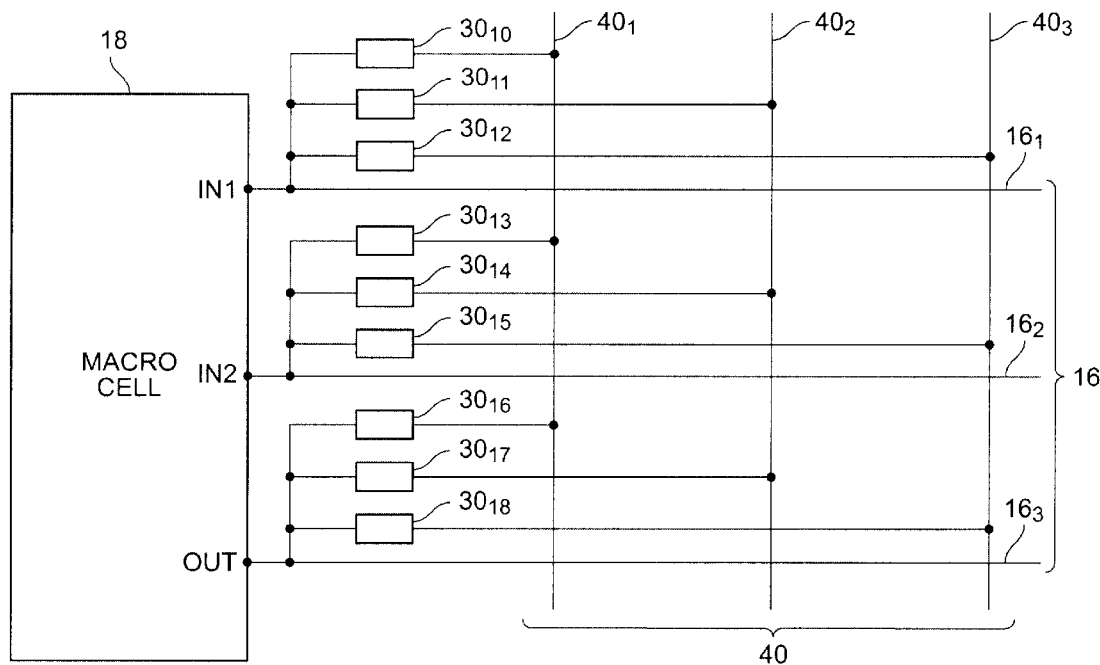
FIG. 7 is an expanded view of a portion of FIG. 6 illustrating the multitude of universal connectors disposed between the short and long buses, in accordance with one embodiment of the present invention.

FIG. 7 illustrates the multitude of connectors 30 disposed between the lines of buses 16 and 40, as described above in connection with dotted perimeter line 42 of FIG. 6, before device 10 is programmed. As seen from FIG. 7, a connector 30 is disposed between each line of bus 16 and each line of bus 40. For example, connector $30_{10}$ is disposed between bus lines $16_1$ and $40_1$; connector $30_{11}$ is disposed between bus lines $16_1$ and $40_2$, and connector $30_{12}$ is disposed between bus lines $16_1$ and $40_3$. Similarly, connector $30_{16}$ is disposed between bus lines $16_3$ and $40_1$; connector 3017 is disposed between bus lines $16_3$ and $40_2$; and connector $30_{18}$ is disposed between bus lines $16_1$ and $40_3$. Therefore, by configuring the nine shown connectors 30 of FIG. 7, each terminal of macro cell 18 may be coupled to or uncoupled from a different one of the lines of bus 40. Furthermore, the direction of the current flow between the two terminals of each connector 30 is so selected as to enable signals to be delivered to input terminals $IN_1$ and $IN_2$ and to be received from output terminal OUT of macro cell 18. The signals delivered to input terminals $IN_1$ and $IN_2$ as well as the signal received from output terminal OUT are carried by the lines of bus 40 when so configured. Each connector 30 of FIG. 7 is selectively and individually configurable, in accordance with the present invention, to provide a specific connectivity between the lines of bus 40 and input/output terminals of macro cell 18 via the lines of bus 16, as described further below.

Figure 8:
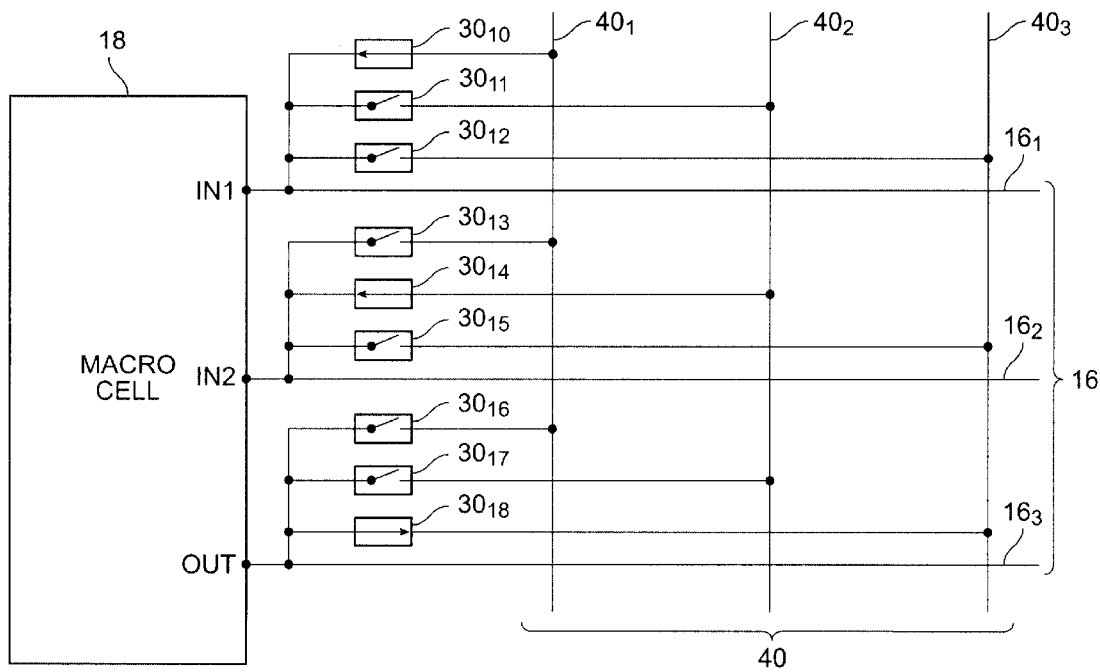
FIG. 8 illustrates the conductive states of the multitude of the universal connectors of FIG. 7 following a configuration process, in accordance with one embodiment of the present invention.

FIG. 8 illustrates the connectivity established between the terminals of macro cell 18 and the lines of bus 40 of FIGS. 6 and 7 following an exemplary configuration operation. In accordance with the data loaded into device 10 during such a configuration operation, connector $30_{10}$ is so configured as to enable current to flow from line $40_1$ to input terminal $IN_1$ of macro cell 18. To inhibit current flow between input terminal $IN_1$ and lines $40_2$ and $40_3$, connectors $30_{11}$ and $30_{12}$ are placed in non-conducting states. Similarly, connector $30_{14}$ is so configured as to enable current to flow from line $40_2$ to input terminal $IN_2$ of macro cell 18. To inhibit current flow between input terminal $IN_2$ and lines $40_1$ and $40_3$, connectors $30_{13}$ and $30_{15}$ are placed in non-conducting states. Connector $30_{18}$ is so configured as to enable current to flow from output terminal OUT of macro cell 18 to line $40_3$. To inhibit current flow between output terminal OUT and lines $40_1$ and $40_2$, connectors $30_{16}$ and $30_{17}$ are placed in non-conducting states.

Figure 9:
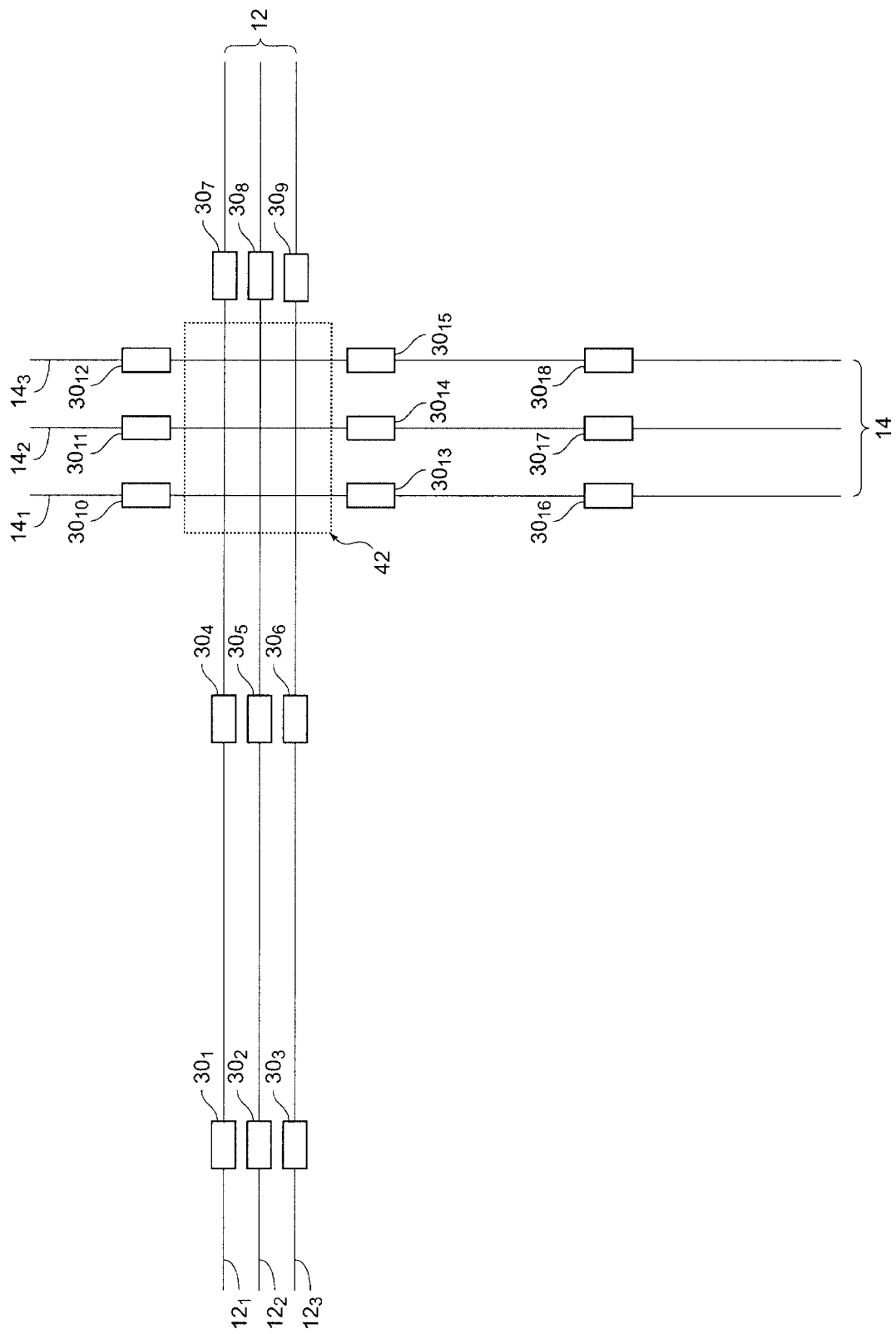
FIG. 9 illustrates a multitude of universal connectors disposed between horizontal long bus lines and vertical long bus lines, in accordance with one embodiment of the present invention.

FIG. 9 illustrates horizontal long bus 12 whose lines are coupled to or uncoupled from the lines of vertical long bus 14 via a number of connectors 30 (not shown in FIG. 9) disposed within the dotted perimeter line 44. Horizontal long bus 12 has three lines 121, 122 and 123 each of which is shown to have four sections. A connector 30 is disposed between adjacent sections of each line of bus 12. Similarly, vertical long bus 14 has three lines 141, 142 and 143 each of which is shown to have four sections. A connector 30 is disposed between adjacent sections of each line of bus 14. Each connector 30 of FIG. 9 is selectively and individually configurable, in accordance with the present invention, to provide a specific connectivity between the lines of buses 12 and 14, as described further below.

Figure 10:
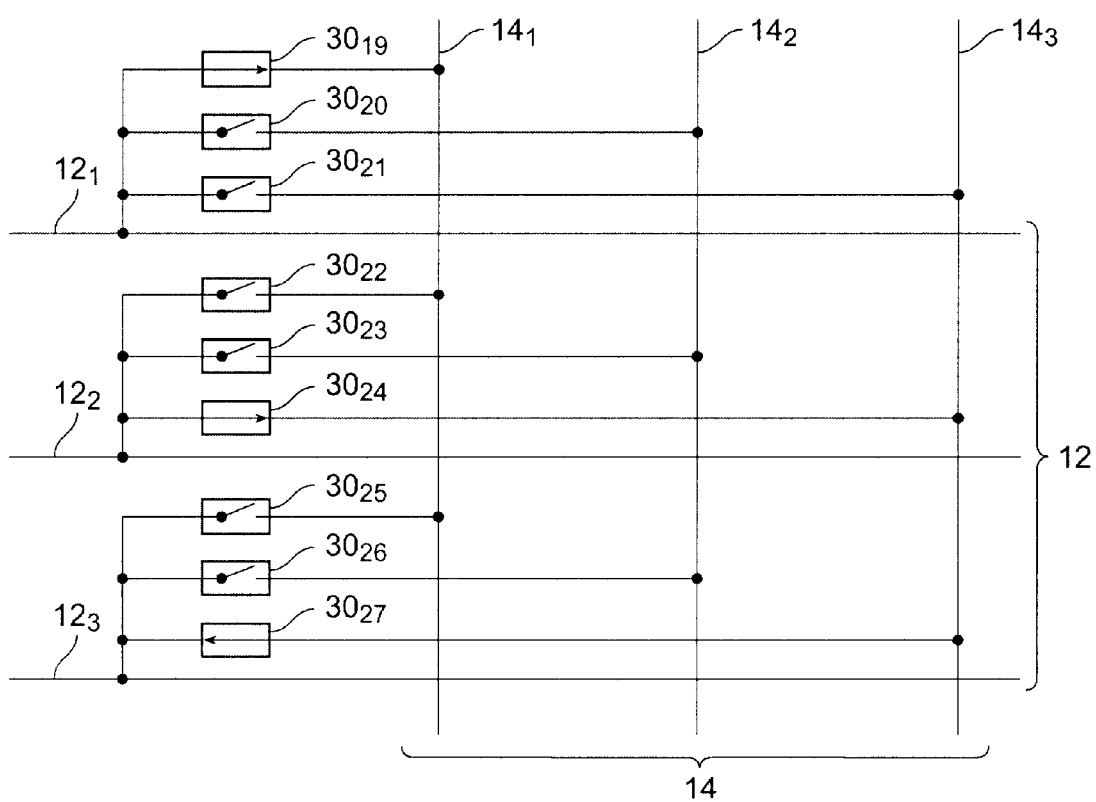
FIG. 10 is an expanded view of a portion of FIG. 9 illustrating the multitude of universal connectors disposed between the horizontal long bus lines and vertical long bus lines, following a configuration process, in accordance with one embodiment of the present invention.

FIG. 10 illustrates the multitude of connectors 30 disposed between the lines of buses 12 and 14, as described above in connection with dashed perimeter line 44 of FIG. 9, following an exemplary configuration operation. In accordance with the data loaded into device 10 during the configuration operation, connector 3019 is configured so as to enable current to flow from line 121 to line 141. To inhibit current flow between line 121 and each of lines 142 and 143, connectors 3020 and 3021 are placed in non-conducting states. Connector 3024 is configured so as to enable current to flow from line 122 to line 143. To inhibit current flow between line 122 and each of lines 141 and 142, connectors 3022 and 3023 are placed in non-conducting states. Connector 3027 is configured so as to enable current to flow from line 143 to line 123. To inhibit current flow between line 123 and each of lines 141 and 142, connectors 3025 and 3026 are placed in non-conducting states.

As seen from FIG. 10 and from the description above, line 142 is not coupled to any of lines 121, 122 and 123. Moreover, since lines 122 and 123 are coupled to one another via line 143, some or all of the current on line 122 flows to line 123 via line 142. Therefore, for instance, by coupling bus lines 122 and 123 respectively to output and input terminals of a macro cell, the signal generated at the output terminal of the macro cell may be delivered to the input terminal of the same macro cell.

Figure 11:
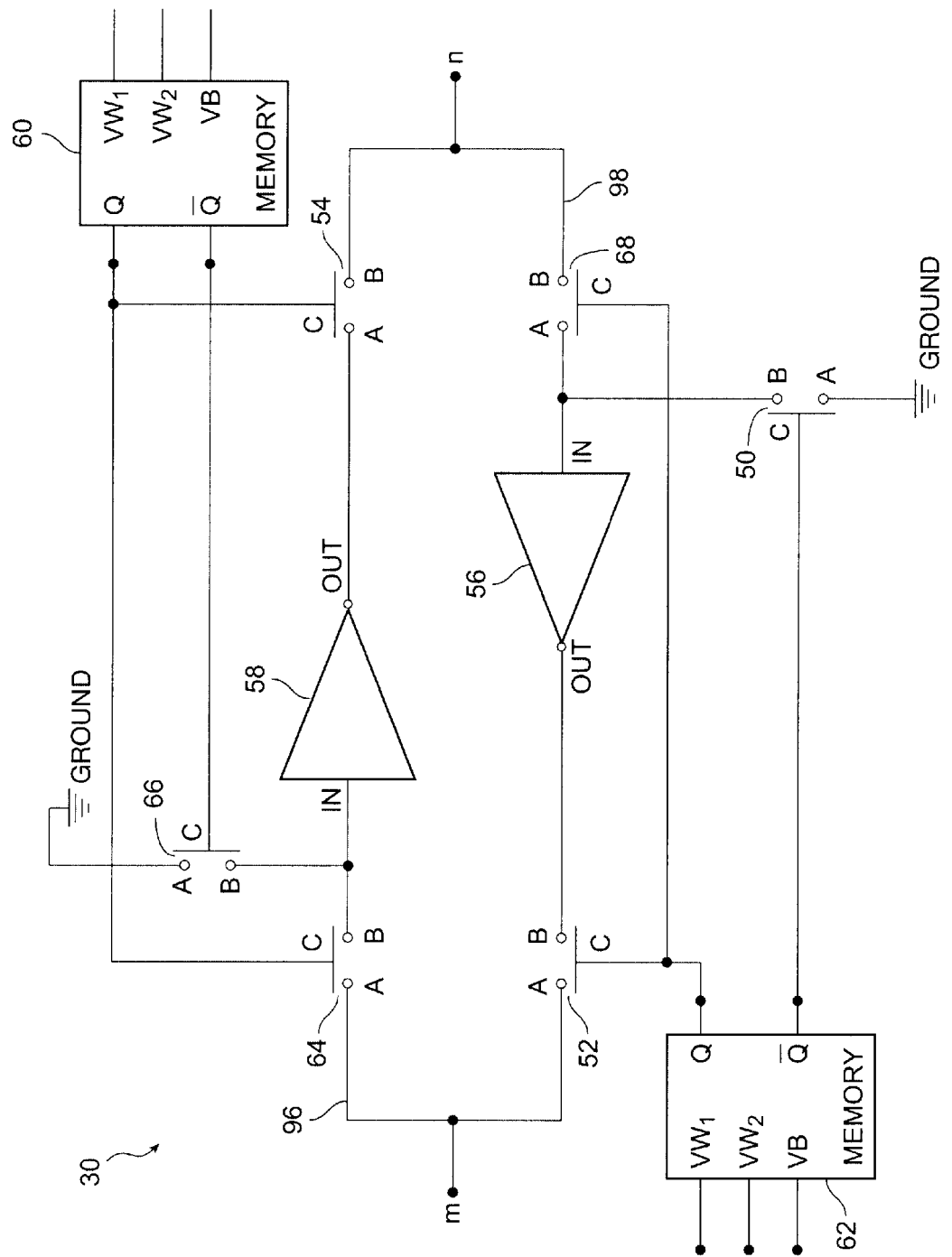
FIG. 11 is a schematic block diagram of a universal connector, in accordance with one embodiment of the present invention.

FIG. 11 is a simplified block diagram of a connector 30, in accordance with one embodiment of the present invention. Connector 30 includes inverters 56, 58, switches 50, 52, 54, 64, 66, 68 and memory elements 60 and 62. Terminals A and B of switch 64 are respectively coupled to terminal m of connector 30 and to input terminal IN of inverter 58. Control terminal C of switch 64 is coupled to output terminal Q of memory element 60. Terminals A and B of switch 68 are respectively coupled to input terminal IN of inverter 56 and to terminal n of connector 30. Control terminal C of switch 68 is coupled to output terminal Q of memory element 62. Terminals A and B of switch 54 are respectively coupled to output terminal OUT of inverter 58 and to terminal n of connector 30. Control terminal C of switch 54 is coupled to output terminal Q of memory element 60. Terminals A and B of switch 52 are respectively coupled to terminal m of connector 30 and to output terminal OUT of inverter 56. Control terminal C of switch 52 is coupled to output terminal Q of memory element 62. Input terminal IN of inverter 58 is also coupled to terminal B of switch 66 whose other input terminal A is coupled to the ground. Control terminal C of switch 66 is coupled to output terminal QB of memory 60. Similarly, input terminal IN of inverter 56 is coupled to terminal B of switch 50 whose other input terminal A is coupled to the ground. Control terminal C of switch 50 is coupled to output terminal QB of memory 62.

The voltages supplied at output terminals Q and QB of each of memory elements 60 and 62 are complements of each other. Therefore, when the voltage at output terminal Q of each memory element 60 and 62 is at a high level, the voltage at the output terminal QB of that memory element is at a low level, and vice versa.

Figure 12:
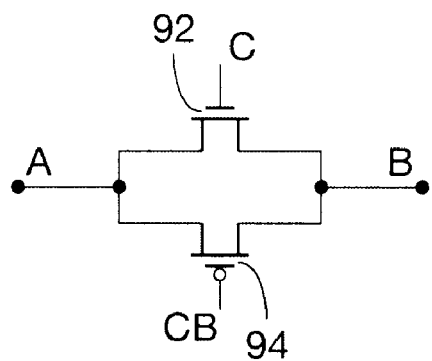
FIG. 12 is a transistor schematic diagram of a CMOS transmission gate, as known in the prior art.

Each of switches 50, 52, 54, 64, 66 and 68 conducts current between its terminals A and B when the voltage applied to the switch's control terminal C is at a predefined value. If, for example, each switch 50, 52, 54, 64, 66, 68 is an NMOS pass gate transistor, the switch is closed if the voltage applied to the switch's control terminal (i.e., gate terminals) C is at a high level, as known to those skilled in the art. If, for example, each switch is a PMOS pass gate transistor, the switch is closed if the voltage applied to the gate terminal C of the switch is at a low level, as known to those skilled in the art. If each switch is a CMOS transmission gate, control terminal C of that switch includes two terminals, one terminal coupled to the gate terminal of the NMOS transistor and one terminal coupled to the gate terminal of the PMOS transistor of the transmission gate, as shown in FIG. 12 and described further below. In FIG. 11, it is assumed that each switch 50, 52, 54, 64, 66 and 68 conducts current when the voltage applied to input terminal C of the switch is at a high level.

Memory elements 60 and 62 are programmed either (1) to enable current to flow from terminal m to terminal n via programmable path 96 (hereinafter referred to as path 96) defined by inverter 58 and switches 54, 64, or (2) to enable current to flow from terminal n to terminal m via programmable path 98 (hereinafter referred to as path 98) defined by inverter 56 and switches 68, 52, or (3) to inhibit current flow between terminals m and n, as described further below.

In accordance with the first programming state, memory element 60 is programmed to supply a high voltage at its output terminal Q and a low voltage at its output terminal QB. Similarly, memory element 62 is programmed to supply a low voltage at its output terminal Q and a high voltage at its output terminal QB. Accordingly, switches 54 and 64 are closed and switches 52 and 68 are open. Since switches 54 and 64 are closed, path 96 is in a conducting stale, thus enabling current to flow from terminal m to terminal n. Since switch 52 and 68 are open, path 98 is in a non-conducting state, therefore, no current flows from terminal n to terminal m. The signal generated at output terminal OUT of inverter 58 is tile inverse of the signal that inverter 58 receives at its input terminal IN. Therefore, signals present at terminals m and n of the connector are inverse of each other.

In accordance with the second programming state, memory element 60 is programmed to supply low and high voltages at its respective output terminals Q and QB. Similarly memory element 62 is programmed to supply high and low voltages at its respective output terminals Q and QB. Accordingly, switches 52 and 68 are closed and switches 54 and 64 are open. Since switches 52 and 68 are closed, path 98 is in a conducting state, thus enabling current to flow from terminal n to terminal m. Since switches 54 and 64 are open, path 96 is in a non-conducting state, therefore, no current flows from terminal m to terminal n. The signal generated at output terminal OUT of inverter 56 is the inverse of the signal that inverter 56 receives at its input terminal IN. Therefore, signals present at terminals n and m of the connector are inverse of each other.

In accordance with the third programming state, memory elements 60 and 62 both are programmed to generate low voltages at their respective output terminals Q and high voltages at their respective output terminals QB. Accordingly, switches 54, 64, 52 and 68 all are open.

Therefore, both paths 96 and 98 are in non-conducting states, thereby inhibiting current flow between terminals n and m. Consequently, in accordance with the present invention and depending on the voltages applied, connector 30 either steers signals from left to right (i.e, from terminal m to terminal n), or from right to left, or inhibits the flow of signals.

Switches 64 and 68 of connector 30 reduce power consumption by isolating inverters 56 and 58 from one another, as described further below. Referring concurrently to FIGS. 4 and 11, if connector 301 is configured to enable current to flow from left to right on line 321 (i.e., from section 3211 to section 3212), the capacitive charging and discharging of section 3212 is performed by inverter 58. Since switch 68 is open when inverter 58 is charging or discharging line 3212, inverter 58 is not loaded with the capacitance associated with the input terminal of inverter 56. Therefore, inverter 58 does not charge or discharge the capacitance associated with the input terminal of inverter 56, thereby reducing the power consumption.

Similarly, switch 64 is open when inverter 56 is charging or discharging the capacitance associated with a line section coupled to terminal m. Accordingly, inverter 56 is not loaded with the capacitance associated with the input terminal of inverter 58. Therefore, inverter 56 does not charge or discharge the capacitance associated with the input terminal of inverter 58, thereby reducing the power consumption.

As describe above, the voltages present on terminals Q and QB of each of memory elements 60 are complements of each other. Therefore, when the voltage at terminal Q of memory element 60 is at a low level to turn switches 64 and 54 off, the voltage at terminal QB of memory 60 is at a high level to turn switch 66 on, thereby to couple input terminal IN of inverter 56 to the ground. The coupling to the ground prevents input terminal IN of inverter 56 from floating when switch 64 is off. Similarly, when the voltage at terminal Q of memory element 62 is at a low level to turn switches 68 and 52 off, the voltage at terminal QB of memory element 62 is at a high level to turn switch 50 on, thereby to couple input terminal IN of inverter 56 to the ground to prevent it from floating.

Memory elements 60 and 62 each has three input terminals that control the voltage levels of their output terminals Q and QB. Accordingly, both the establishment of a conduction path between terminals (alternatively referred to as nodes) m and n, as well as the direction of the current flow between nodes m and n—when a conduction path is established—is controlled by the voltages applied to input terminals of memory elements 60 and 62 during the configuration process.

In some embodiments of the present invention, switches 52, 54, 64 and 68 are each CMOS transmission gates to enable operation with low voltage supplies. FIG. 12 shows a transistor schematic diagram of a CMOS transmission gate that includes an NMOS transistor 92 and a PMOS transistor 94, in accordance with such an embodiment. The voltages applied to control gates C and CB of the CMOS transmission gate are complements of each other. If the voltages applied to terminals C and CB are respectively at low and high levels, the switch is open and no current flows between terminals A and B of the transmission gate. If the voltages applied to terminals C and CB are respectively at high and low levels, the switch is closed and current flows between terminals A and B of the transmission gate. Since both the NMOS and the PMOS transistors are conducting when voltages applied to terminals C and CB are at high and low levels, respectively, there is relatively small voltage (e.g., 10 mv) drop between terminals A and B of the switch, thus enabling the switch to operate even when supply voltages are low, e.g., 1.3 volts. Control gates C and CB of the transmission gate are coupled to output terminals Q and QB of the memory elements 60 and 62, as shown in with FIG. 14.

Figure 14:
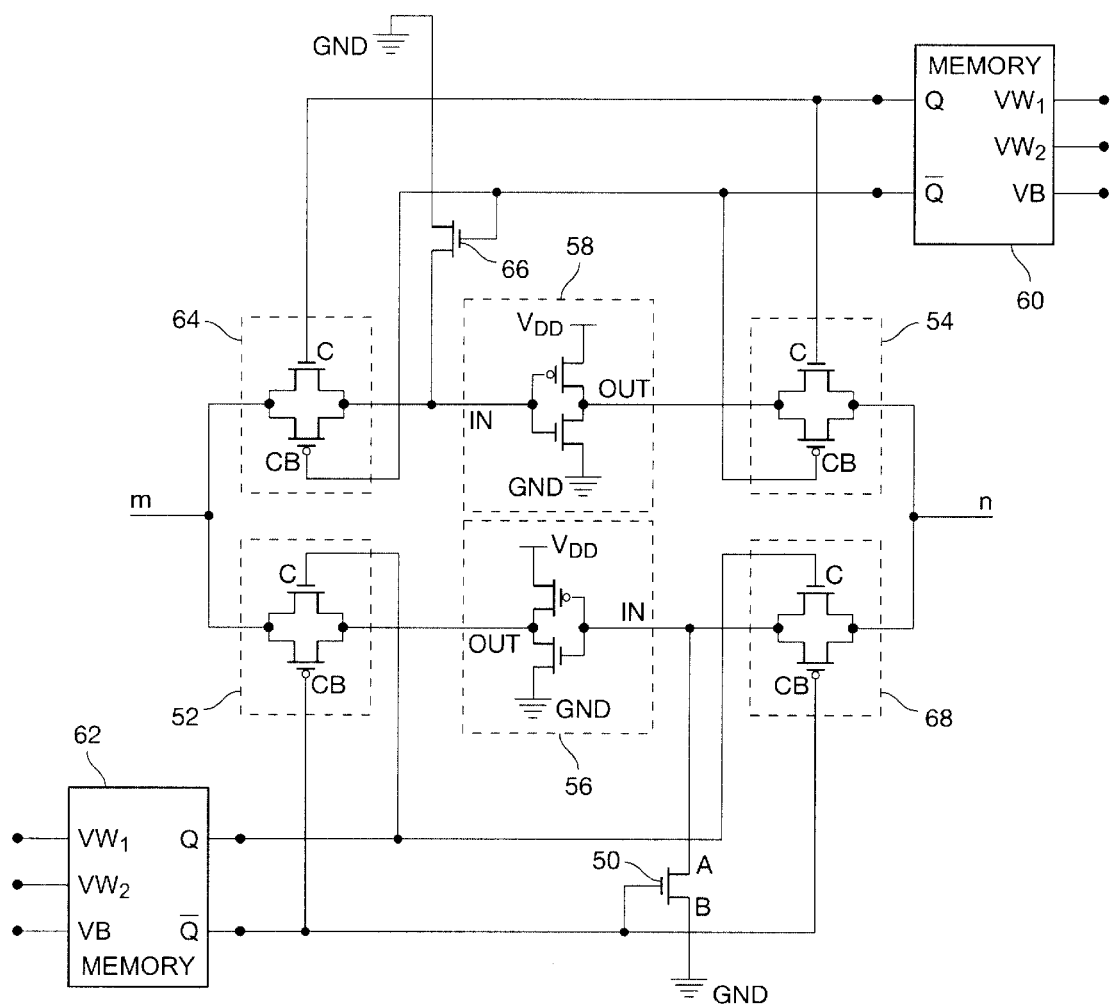
FIG. 14 is a combined block/transistor diagram of the universal connector of FIG. 11, in accordance with one embodiment of the present invention.

In some embodiments, inverters 56 and 58 each is a CMOS inverter having an NMOS and a PMOS transistor, as is known in the art (see FIG. 14). Each of the inverters 56 and 58 is a buffer and each provides a voltage gain that reduces the rise and fall time of the signal the inverter receives, thereby to restore the signal's shape, as described further below.

Internally generated signals, such as those generated by a macro cell 18, typically have rapid transitions, in other words, they have fast rise and fall times. However, the rise and fall times associated with such signals increase as the signals are carried from one location to another location over a bus—such as any of the buses shown and described above. The longer the bus, the higher are its resistance and capacitance and thus the longer are the rise and fall times of any signal that the bus carries. The increases in signal rise and fall times, in turn, increase the time period that it takes for the signal to arrive at its destination, thereby lowering the operation speed and the performance. To improve performance by reducing the travel time of a signal from its source (e.g., a macro cell) to its destination (e.g., another macro cell) when the signal is carried over a long bus, inverters 56 and 58 each provides a voltage gain that reduces the rise and fall times of the signal that is applied to the inverter. In other words, inverters 56 and 58 of connector 30 each, in addition to being an inverting circuit, is also a wave shaping circuit.

Figure 13:
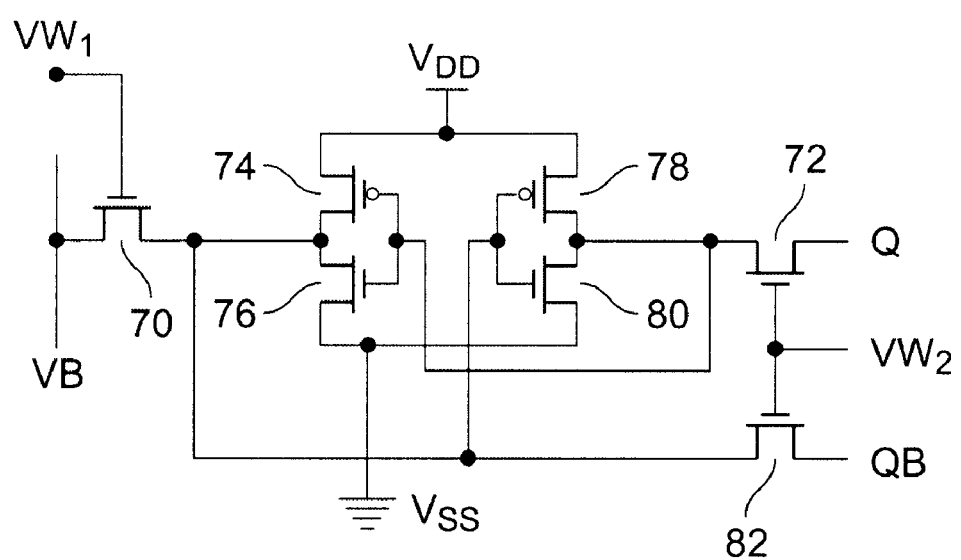
FIG. 13 is a transistor schematic diagram of a programmable memory element disposed in the universal connector of FIG. 11, in accordance with one embodiment of the present invention.

FIG. 13 is a transistor schematic diagram of each of memory elements 60 and 62, in accordance with one embodiment of the present invention. The gate and drain terminals of NMOS transistor 70 are respectively coupled to input terminals VW1 and VB of the memory element. The source terminal of transistor 70 is coupled to the drain terminals of PMOS transistor 74 and NMOS transistor 76, to gate terminals of NMOS transistor 80 and PMOS transistor 78, as well as to the drain terminal of NMOS transistor 82. The source terminals of PMOS transistor 74 and NMOS transistors 76 are respectively coupled to first voltage supply Vdd and to the ground terminal. The gate terminals of PMOS transistor 74 and NMOS transistors 76 are coupled to the drain terminals of NMOS transistor 80 and PMOS transistors 78, as well as to the drain terminal of NMOS transistor 72. The source terminals of PMOS transistor 78 and NMOS transistors 80 are respectively coupled to the first voltage supply Vdd and to the ground terminal. The gate terminals of NMOS transistors 72 and 82 are coupled to input terminal VW2 of the memory element. The source terminal of NMOS transistor 72 is coupled to output terminal Q of the memory element. The source terminal of NMOS transistor 82 is coupled to output terminal QB of the memory element. The operation of the memory element of FIG. 12 is described below.

To generate high and low voltages at output terminals Q and QB, a high voltage is applied to input terminal VW1 and a low voltage is applied to input terminal VB during a configuration process. The low voltage applied to terminal VB is transferred to the gate terminals of PMOS transistor 78 and NMOS transistor 80—via transistor 70—causing NMOS transistor 80 to turn off and PMOS transistor 78 to turn on. Therefore, the voltage at the drain terminals of transistors 78 and 80 is pulled up to the supply voltage Vdd.

The high voltage present at the drain terminals of transistors 78 and 80 causes NMOS transistor 76 to turn on and PMOS transistor 74 to turn off which, in turn, causes the voltage at the drain terminals of transistor 74 and 76 to go low. Therefore, the low voltage applied to input terminal VB is latched, thereby causing the voltage present at the drain terminals of transistors 78, 80 and 72 to be maintained at a high level. The low voltage present at the drain terminal of transistor 82 is maintained at a low level. During the configuration process, the voltage applied to input terminal VW2 is maintained at a low level to keep transistors 72 and 82 off, thus isolating the drain terminals of transistors 78, 80, 72 from output terminal Q and also isolating the drain terminal of transistor 82 from output terminal QB. After the configuration process is terminated, the voltage applied to input terminal VW2 is raised to a high level to pass the high voltage present at the drain terminals of transistors 72, 78 and 80 to output terminal Q as well as to pass the low voltage present at the drain terminal of transistors 82 to output terminal QB.

To generate low and high voltages at output terminal Q and QB, high voltages are applied to input terminals VW1 and VB, during a configuration process. The high voltage applied to terminal VB is transferred to the gate terminals of PMOS transistor 78 and NMOS transistor 80—via transistor 70—causing NMOS transistor 80 to turn on and PMOS transistor 78 to turn off. Therefore, the voltage at the drain terminals of transistors 78 and 80 is pulled to the ground potential. The low voltage present at the drain terminals of transistors 78 and 80 causes NMOS transistor 76 to turn off and PMOS transistor 74 to turn on which, in turn, causes the voltage at the drain terminals of transistor 74 and 76 to go high. Therefore, the high voltage applied to input terminal VB is latched. Accordingly, the drain terminal of transistors 72 and 82 respectively store low and high voltages. After the configuration process is terminated, the voltage applied to input terminal VW2 is raised to a high level to pass the low voltage present at drain terminals of transistors 72, 78 and 80 to output terminal Q as well as to pass the high voltage present at drain terminal of transistor 82 to output terminal QB.

FIG. 14 is a combined block/transistor schematic diagram of a connector 30, in accordance with the embodiments that were described above. In FIG. 14, switches 52, 54, 64 and 68 each is a CMOS transmission gate. The C terminals of transmission gates 54 and 64 are coupled to output terminal Q of memory element 60. The CB terminals of transmission gates 54 and 64 are coupled to output terminal QB of memory element 60. The C terminals of transmission gates 52 and 68 are coupled to output terminal Q of memory element 62. The CB terminals of transmission gates 52 and 68 are coupled to output terminal QB of memory element 62. Inverters 58 and 56 each is a CMOS inverter which includes a PMOS and a NMOS transistor, as is known in the art. Switches 50 and 66 each is an NMOS transistor whose source terminal is coupled to the ground. The gate and drain terminals of NMOS transistor 50 are respectively coupled to output terminal QB of memory element 62 and to the gate terminal of inverter 56. The gate and drain terminals of NMOS transistor 66 are respectively coupled to output terminal QB of memory element 60 and to the gate terminal of inverter 58. The transistor schematic diagram of each of memory elements 60 and 62 is shown in FIG. 13 and described above.

To pass a signal from terminal m to terminal n, memory elements 60 and 62 are respectively configured to generate high and low voltages at their respective terminals Q, and low and high voltages at their respective terminals QB. As a result of such configuration, transmission gates 64 and 54 are on while transmission gates 68 and 52 are off. Therefore, path 96 is in a conducting state, thus enabling signal transfer from terminal m to terminal n. Since transmission gates 68 and 52 are off, path 98 is in a non-conducting state, thus preventing signal transfer from terminal n to terminal m. Because the voltage at output terminal QB of memory element 62 is at a high level, NMOS transistor 50 is on, thereby causing the voltage at input terminal IN of inverter 56 to be pulled to the ground potential. Furthermore, because transmission gate 68 is off, inverter 58 is not loaded with the input capacitance of inverter 56, thus reducing power consumption. The signal present at terminal n is the inverse of the signal at terminal m. To ensure that the signal at terminal n is not inverted, a second inverter may be disposed in path 96 and in series with inverter 58, as is known to those skilled in the art.

To pass a signal from terminal n to terminal m, memory elements 60 and 62 are respectively configured to generate low and high voltages at their respective terminals Q, and high and low voltages at their respective terminals QB. As a result of such configuration, transmission gates 68 and 52 are on while transmission gates 64 and 54 are off. Therefore, path 98 is in a conducting state, thus enabling signal transfer from terminal n to terminal m. Since transmission gates 64 and 54 are off, path 96 is in a non-conducting state, thus preventing signal transfer from terminal m to terminal n. Because the voltage at output terminal QB of memory element 60 is at a high level, NMOS transistor 66 is on, thereby causing the voltage at input terminal IN of inverter 58 to be pulled to the ground potential. Furthermore, because transmission gate 64 is off, inverter 56 is not loaded with the input capacitance of inverter 58, thus reducing power consumption The signal present at terminal m is the inverse of the signal at terminal n. To ensure that the signal at terminal m is not inverted, a second inverter may be disposed in path 98 and in series with inverter 56.

To inhibit signal transfer between terminals m and n, memory elements 60 and 69 are respectively configured to generate low voltages at their respective terminals Q, and to generate high voltages at their respective terminals QB. As a result of such configuration, transmission gates 52, 54, 64 and 68 are off. Therefore, paths 96 and 98 both are in non-conducting states, thus inhibiting signal transfer between terminals m and n.

The above embodiments of the present invention are illustrative and not limitative. For example, the invention is not limited by the type of switch, inverter or memory element that is disposed within the universal connector, in accordance with the present invention. Nor is the invention limited by the type of the technology, CMOS, Bipolar, BICMOS or otherwise that may be used to from the universal connector. The invention is not limited by the type of integrated circuit in which the universal connector is disposed. For example, the universal connector, in accordance with the present invention, may be disposed in a programmable logic device, a SoC or any other IC which may require configurability. Nor is the invention limited by the type of logic cell, macro cell or otherwise, that may be configured using the universal connector of the present invention. Other additions, subtractions or modification are obvious in view of the present invention and are intended to fall within the scope of the appended claims.

What is claimed is:

1. A low-voltage programmable connector comprising:
a first terminal and a second terminal;
a first path having disposed therein a first transmission gate, a second transmission gate and a first buffer, each of the first and second transmission gates having a first terminal that is coupled to a different one of the first and second terminals of the connector, and a second terminal that is coupled to one of input and output terminals of the first buffer, wherein a first control terminal of each of the first and second transmission gates receives a first voltage and wherein a second control terminal of each of the first and second transmission gates receives a second voltage; and a second path having disposed therein a third transmission rate, a fourth transmission gates and a second buffer, each of the third and fourth transmission(gates having a first terminal that is coupled to a different one of the first and second terminals of the connector, a second terminal that is coupled to one of input and output terminals of the second buffer, wherein a first control terminal of each of the third and fourth transmission gates receives a third voltage and wherein a second control terminal of each of the first and second transmission gates receives a fourth voltage.

2. The low-voltage programmable connector of claim 1 wherein each of the first and second buffers includes at least one CMOS inverter.

3. The low-voltage programmable connector of claim 1 wherein the input terminal of the first buffer is further coupled to a drain terminal of a first transistor whose source terminal is coupled to the ground and whose gate terminal receives the second voltage, and wherein the input terminal of the second buffer is further coupled to a drain terminal of a second transistor whose source terminal is coupled to the ground and whose gate terminal receives the fourth voltage.

4. The low-voltage programmable connector of claim 3 wherein the first and second voltages are respectively generated by a first programmable memory clement and wherein the third and fourth voltages are respectively generated by a second programmable memory element.

5. The low-voltage programmable connector of claim 4 wherein each of the first and second programmable memory elements is selected from a group consisting of register, fuse, volatile memory and non-volatile memory.

6. A method for controlling signal transfer between a first node and a second node, the method comprising:

transferring the signal from the first node to the second node via a first path in which first and second transmission gates are disposed and inhibiting the signal transfer from the second node to the first second node via a second path in which third and fourth transmission gates are disposed if first and second programmable voltages applied to the first and second transmission gates are respectively at first and second predefined values, and third and fourth programmable voltages applied to the third and fourth transmission gates are respectively at the second and first predefined values;

transferring the signal from the second node to the first node via the second path and inhibiting the signal transfer from the first node to the second node via the first path if the first and second programmable voltages are respectively at the second and first predefined values, and third and fourth programmable voltages applied to the third and fourth transmission gates are respectively at the first and second predefined values; and inhibiting the signal transfer between the first and second nodes via both the first and second paths if the first and second programmable voltages are at the second and first predefined values and the third and fourth programmable voltages are at the second and first predefined values.

7. The method of claim 6 further comprising:

buffering the signal transferred via the first path.

8. The method of claim 7 further comprising:

buffering the signal transferred via the second path.

9. The method of claim 8 further comprising:

coupling an input terminal of the first transmission gale to the g(round.

10. The method of claim 9 further comprising:

coupling an input terminal of the third transmission gate to the ground.

11. A programmable gate array comprising:

a horizontal bus having a plurality of lines;

a vertical bus having a plurality of lines; and a plurality of programmable connectors disposed between the plurality of lines of the horizontal bus and the plurality of lines of the vertical bus, each programmable connector further comprising:

a first terminal and a second terminal;

a first path having disposed therein a first transmission gate, a second transmission gate and a first buffer, each of the first and second transmission gates having a first terminal that is coupled to a different one of the first and second terminals of the connector, and a second terminal that is coupled to one of input and output terminals of the first buffer, wherein a first control terminal of each of the first and second transmission gates receives a first voltage and wherein a second control terminal of each of the first and second transmission gates receives a second voltage; and a second path having disposed therein a third transmission gate, a fourth transmission gates and a second buffer, each of the third and fourth transmission gates having a first terminal that is coupled to a different one of the first and second terminals of the connector, a second terminal that is coupled to one of input and output terminals of the second buffer, wherein a first control terminal of each of the third and fourth transmission gates receives a third voltage and wherein a second control terminal of each of the first and second transmission gates receives a fourth voltage.

12. The programmable gate array of claim 11 wherein each of the first and second buffers includes at least one CMOS inverter.

13. The programmable gate array of claim 11 wherein the input terminal of the first buffer is further coupled to a drain terminal of a first transistor whose source terminal is coupled to the ground and whose gate terminal receives the second voltage, and wherein the input terminal of the second buffer is further coupled to a drain terminal of a second transistor whose source terminal is coupled to the ground and whose gate terminal receives the fourth voltage.

14. The programmable gate array of claim 13 wherein the first and second voltages are respectively generated by a first programmable memory element and wherein the third and fourth voltages are respectively generated by a second programmable memory element.

15. The low-voltage programmable connector of claim 14 wherein each of the first and second programmable memory elements is selected from a group consisting of register, fuse, volatile memory and non-volatile memory.

* * * * *